United States Patent
Casagrande

(10) Patent No.: US 8,638,884 B2
(45) Date of Patent: Jan. 28, 2014

(54) DATA PROCESSING UNIT AND SIGNAL RECEIVER INCLUDING THE DATA PROCESSING UNIT

(75) Inventor: Arnaud Casagrande, Bole (CH)

(73) Assignee: The Swatch Group Research and Development Ltd, Marin (CH)

( * ) Notice: Subject to any disclaimer, the term of this patent is extended or adjusted under 35 U.S.C. 154(b) by 88 days.

(21) Appl. No.: 13/276,429

(22) Filed: Oct. 19, 2011

(65) Prior Publication Data

US 2012/0099633 A1      Apr. 26, 2012

(30) Foreign Application Priority Data

Oct. 22, 2010   (EP) ..................................... 10188479

(51) Int. Cl.
*H04L 27/00* (2006.01)
(52) U.S. Cl.
USPC ........... 375/326; 375/226; 375/316; 375/324; 375/327; 375/334; 375/371; 375/373; 375/376; 455/130; 455/260; 455/516; 327/147; 327/156; 327/163; 370/516; 329/360
(58) Field of Classification Search
USPC ......... 375/334, 226, 316, 324, 326, 327, 371, 375/373, 376; 455/130, 260, 516; 370/516; 327/147, 156, 163; 329/360
See application file for complete search history.

(56) References Cited

U.S. PATENT DOCUMENTS

| | | | | |
|---|---|---|---|---|
| 5,926,513 A * | 7/1999 | Suominen et al. | ............ | 375/346 |
| 6,937,683 B1 * | 8/2005 | Ratzel | ........................... | 375/376 |
| 6,965,655 B1 * | 11/2005 | Mostov et al. | ................. | 375/345 |
| 7,423,492 B2 * | 9/2008 | Seefeldt | .......................... | 331/25 |
| 7,447,286 B2 * | 11/2008 | Forrester | ....................... | 375/346 |
| 2007/0140392 A1 | 6/2007 | Cha et al. | | |
| 2009/0147901 A1 | 6/2009 | Do et al. | | |
| 2010/0231195 A1 * | 9/2010 | Higashino | .................. | 324/76.77 |

FOREIGN PATENT DOCUMENTS

KR      10 2004 0006661      1/2004

OTHER PUBLICATIONS

European Search Report issued Aug. 2, 2011 in European Application No. 10 18 8479, filed on Oct. 22, 2010.

* cited by examiner

*Primary Examiner* — Leon Flores
(74) *Attorney, Agent, or Firm* — Oblon, Spivak, McClelland, Maier & Neustadt, L.L.P.

(57) ABSTRACT

The data processing unit (15) for a receiver of signals carrying information (1) includes a clock and data recovery circuit (16) on the basis of a data signal ($D_{OUT}$), and a processor circuit (17) connected to the clock and data recovery circuit. The clock and data recovery circuit is clocked by a local clock signal (CLK) and includes a numerical phase lock loop, in which a numerically controlled oscillator (25) is arranged. This numerically controlled oscillator generates an in-phase pulse signal ($I_P$) and a quadrature pulse signal ($Q_P$) at output. The frequency and phase of the pulse signals $I_P$ and $Q_P$ are adapted on the basis of the received data signal ($D_{OUT}$). The processor circuit is arranged to calculate over time the mean and variance of the numerical input signal ($NCO_{IN}$) of the numerically controlled oscillator (25), so as to determine the coherence of the data signal if the calculated mean and variance are below a predefined coherence threshold.

14 Claims, 2 Drawing Sheets

Figure 1:
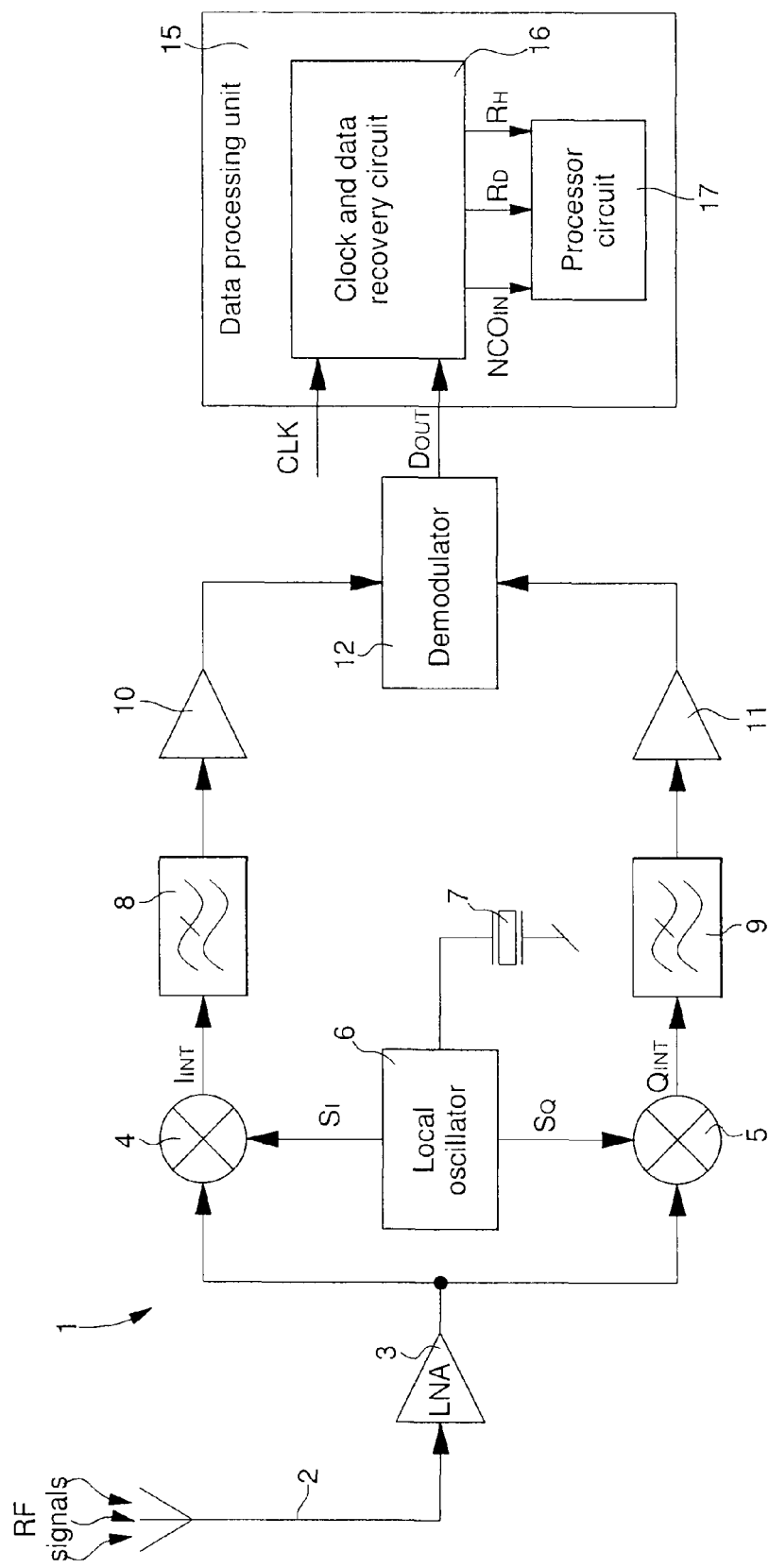

DATA PROCESSING UNIT AND SIGNAL RECEIVER INCLUDING THE DATA PROCESSING UNIT

This application claims priority from European Patent Application No. 10188479.9 filed Oct. 22, 2010, the entire disclosure of which is incorporated herein by reference.

FIELD OF THE INVENTION

The invention concerns a data processing unit for a receiver of signals carrying information. The processing unit includes a clock and/or data recovery circuit and a processor circuit. The processing unit is provided in the signal receiver, in particular, firstly for performing a coherence check of a data signal.

The invention also concerns a receiver for signals carrying information, which includes a data processing unit capable of evaluating the coherence of the data in the data signal.

BACKGROUND OF THE INVENTION

The data signal coherence check by the data processing unit may be applied to any type of receiver, even for direct reception of an unprocessed data signal on a channel or in a wired manner. This data signal is generally defined by a sequence of bits over time. "Data coherence" essentially means the reliability of the modulated or non-modulated data, picked up by the signal receiver.

Usually a digital radio frequency receiver produces a demodulated data signal at the output of a demodulator, when the data is extracted from the incoming radio frequency signals, which were transmitted by a transmitter. Data modulation in the radio frequency signals on the carrier frequency may be of various types. It may be frequency shift keying (FSK), amplitude shift keying (ASK) or ON-OFF keying (OOK).

In a conventional receiver, there are several steps to determine whether the information contained in the received radio frequency signals is deemed suitable, i.e. the data is correct and can be used by the receiver. If the frequency of the received radio frequency signals is first of all converted via at least one mixer unit and by means of oscillating signals from a local oscillator, the frequency of the intermediate signal at the mixer unit output must be within a specific frequency range. The strength or power of the received radio frequency signals must also be greater than a noise level, which characterises the receiver. The strength or power may be checked via a received signal strength indicator. An error calculation may also be carried out after data demodulation on the basis of the demodulated data signal, when the data is processed in the receiver. This error calculation must provide a value lower than a defined threshold (CRC).

Subsequently, the receiver must also synchronise the data clock with the local clock thereof on the basis of the data signal. This must be done to enable the data in the radio frequency signals picked up by the receiver to be digitally processed. Generally, with this type of conventional receiver, complete data pack acquisition is performed taking account of correct data transitions in the data signals. An error calculation of all the data may be carried out as indicated hereinbefore. If it is observed that the data in the received radio frequency signals is not correct after all the data processing, everything is then reset to enable the receiver to pick up other radio frequency signals. This constitutes a drawback, since there must therefore be a long period of processing all the data before the receiver is reset if the data is incorrect.

SUMMARY OF THE INVENTION

It is thus an object of the invention to provide a data processing unit for a receiver of signals carrying information, which is capable of checking, rapidly and immediately, the coherence of the data signal prior to performing all of the subsequent data processing operations, and which overcomes the drawbacks of the state of the art.

The invention therefore concerns a data processing unit for a receiver of signals carrying data, said unit including:
- a clock and data recovery circuit, which is clocked by a local clock signal and which includes a numerical phase lock loop, in which there is arranged a numerically controlled oscillator, which generates at output at least one pulse signal, the phase and frequency of which can be adapted on the basis of a data signal received at the input of the clock and data recovery circuit, and
- a processor circuit connected to the clock and data recovery circuit, characterized in that the processor circuit is arranged to be able to calculate the mean and variance over time of the numerical input signal ($NCO_{IN}$) of the numerically controlled oscillator so as to determine the coherence of the data signal if the calculated mean and variance are below a predefined coherence threshold, and to be able to perform a reset of the receiver if the calculated mean or variance of the numerical input signal ($NCO_{in}$) of the numerically controlled oscillator are above the predefined coherence threshold.

Specific embodiments of the data processing unit are defined in the dependent claims 2 to 11.

One advantage of this data processing unit of the invention lies in the fact that it can rapidly determine whether the data in the data signal received at the clock and data recovery input is correct, and not noise or incorrect data. In order to do this, the processor circuit calculates the mean and variance of the numerically controlled oscillator input signal in the numerical phase lock loop of the clock and data recovery circuit. This calculation is carried out at each pulse of a pulse signal from the numerically controlled oscillator following a binary transition in the data signal. If both the mean over time and the variance of the input signal are close to 0, this immediately means that the data signal is coherent. Under these conditions, all of the subsequent operations can be carried out in the processing unit. Should the opposite occur, the receiver can be immediately reset or triggered via the data processing unit.

The invention therefore also concerns a receiver of signals carrying data, said receiver including:
- an antenna for receiving signals carrying data,
- at least one low noise amplifier for amplifying and filtering the signals picked up by the antenna,
- a local oscillator for supplying high frequency oscillating signals ($S_I$, $S_Q$),
- at least one mixer unit for mixing the received filtered and amplified signals with the high frequency oscillating signals supplied by the local oscillator in order to produce intermediate signals ($I_{INT}$, $Q_{INT}$), whose frequency is equal to the difference between the frequency of the high frequency oscillating signals and a carrier frequency of the received signals,
- at least one low pass filter for filtering the intermediate signals,
- a demodulator receiving the filtered intermediate signals to supply a data signal ($D_{OUT}$) to a data processing unit according to claim 1, said processing unit including a clock and data recovery circuit, which is clocked by a local clock signal and which includes a numerical phase lock loop with a numerically controlled oscillator, and a processor circuit connected to the clock and data recovery circuit and intended to calculate overtime the mean and variance of the numerical input signal ($NCO_{in}$) of the numerically controlled oscillator to determine the coherence of the data signal if the calculated mean and variance are below a predefined coherence threshold.

SUMMARY OF THE INVENTION

Figure 2:
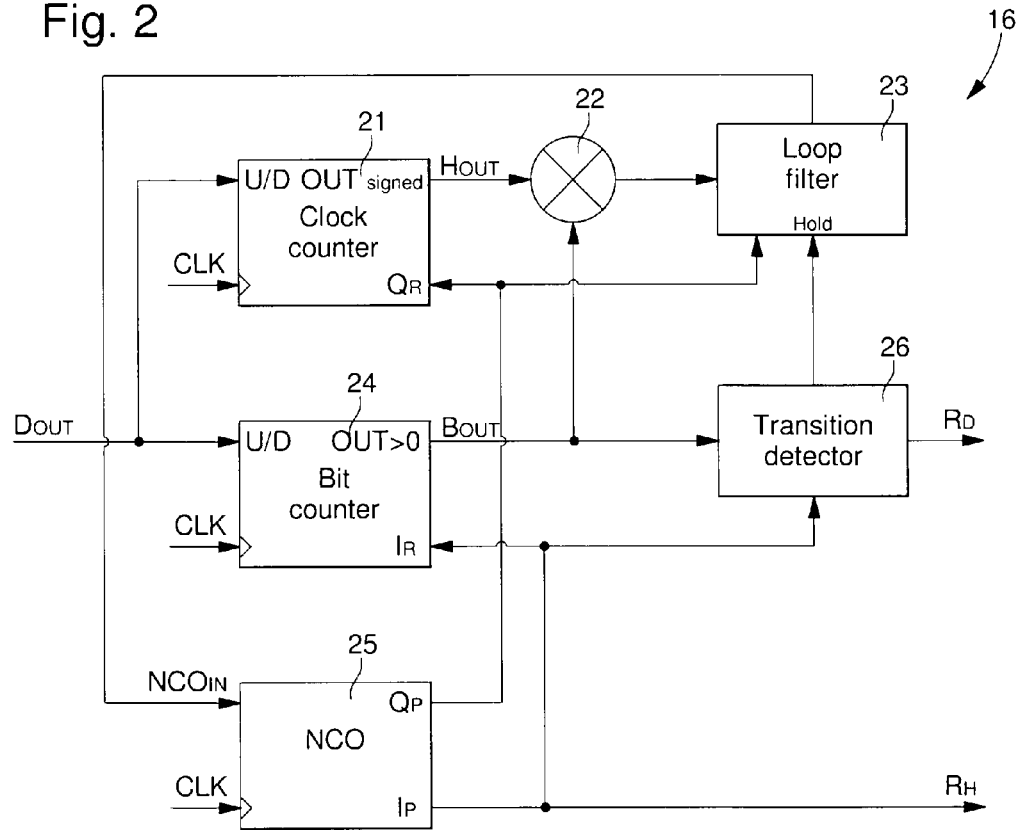
Figure 3:
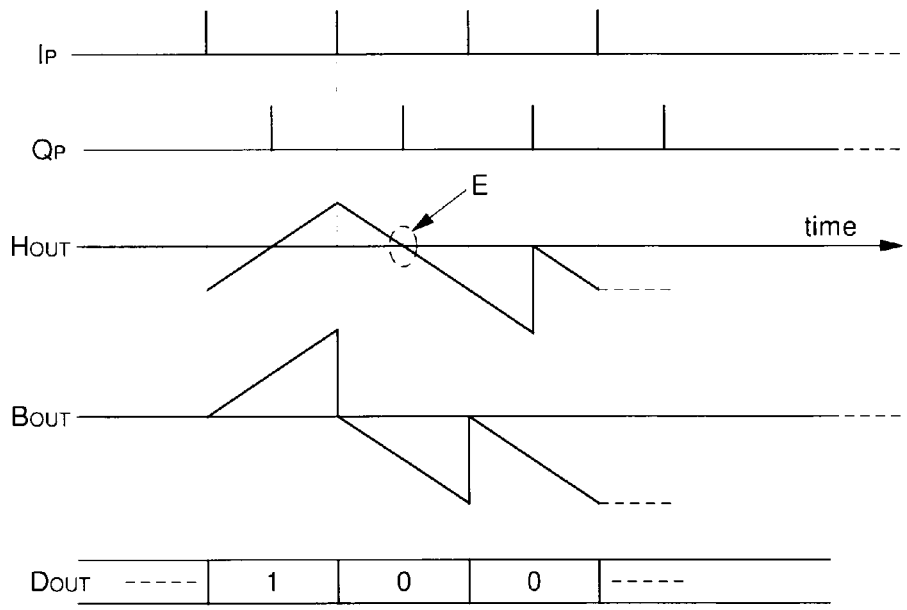

The objects, advantages and features of a data processing unit for a receiver of signals carrying information will appear more clearly in the following description given on the basis of at least one non-limiting embodiment, illustrated by the drawings, in which:

FIG. 1 shows a simplified view of an embodiment of a data signal receiver, such as an FSK signal receiver, which includes a data processing unit according to the invention, FIG. 2 shows the various electronic units of the clock and data recovery circuit of the data processing unit according to the invention, and FIG. 3 shows a temporal graph of the various signals of the clock and data recovery circuit of the data processing unit according to the invention.

DETAILED DESCRIPTION OF THE INVENTION

In the following description, all those components of the data signal receiver that are well known to those skilled in the art in this technical field will be described only in a simplified manner. The receiver may for example be an FSK signal receiver, but any other type of receiver in which a data processing unit according to the invention can be used may be envisaged.

FIG. 1 shows a data signal receiver 1. This signal receiver is, for example, a radio frequency (RF) signal receiver, which has a data processing unit 15 according to the invention, which is capable of calculating the coherence of a data signal $D_{OUT}$.

The radio frequency signal receiver 1 may be a conventional FSK RF signal receiver, in which RF signals received by an antenna 2 can be frequency converted in two distinct quadrature branches. Each branch includes a mixer 4, 5 for performing the frequency conversion with oscillating signals supplied by a local oscillator 6. Local oscillator 6 may include a frequency synthesiser which supplies an in-phase oscillating signal $S_I$ and a quadrature oscillating signal $S_Q$. This frequency synthesiser is generally connected to a quartz oscillator 7, which supplies a determined reference frequency signal for the frequency and phase lock loop of the synthesiser.

In a first branch, a first, for example, high frequency mixer 4 mixes the RF signals received by antenna 2 and amplified by a low noise amplifier (LNA) 3 with in-phase oscillating signals $S_I$ to provide an intermediate in-phase signal $I_{INT}$. In a second branch, a second, for example high frequency mixer 5 mixes the filtered and amplified RF signals with the quadrature oscillating signal $S_Q$ to supply an intermediate quadrature signal $Q_{INT}$. The intermediate signals $I_{INT}$ and $Q_{INT}$ may for example be baseband signals following a direct frequency conversion. These intermediate signals $I_{INT}$ and $Q_{INT}$ are then each filtered in a respective low-pass filter 8 and 9 to provide filtered signals. The filtered signals then each pass through a respective amplifier limiter 10 and 11 prior to data demodulation in the conventional demodulator 12.

On the basis of the filtered and amplified intermediate in-phase signal and the filtered and amplified quadrature signal, demodulator 12 supplies a data signal $D_{OUT}$, which is a binary signal or data flow. The two intermediate in-phase and quadrature signals $I_{INT}$ and $Q_{INT}$ are necessary for the data demodulation. For example, they can discriminate between the frequency deviation sign in the case of frequency key shifting of the data in the received RF signals.

Demodulator 12 may be a simple D type flip-flop, which receives at input D, for example the intermediate in-phase signal $I_{INT}$ and is clocked at the clock terminal thereof by the intermediate quadrature signal $Q_{INT}$. With this flip flop and according to the state of each data bit, the flip-flip output is at level 1 or level 0 in binary data signal $D_{OUT}$.

The RF signal receiver also includes a data processing unit 15, which receives the binary data signal $D_{OUT}$ from demodulator 12. This binary data signal is supplied to a clock and data recovery circuit 16, which is clocked by a local clock signal CLK. The clock and data recovery circuit mainly includes a numerical phase lock loop, in which a numerically controlled oscillator (NCO) is arranged, as explained in more detail hereinafter with reference to FIGS. 2 and 3. Data processing unit 15 also includes at least one processor circuit 17, which is connected to the clock and data recovery circuit 16. The processor circuit is able to calculate the mean and variance over time of a numerical input signal or a binary input word $NCO_{IN}$ of the numerically controlled oscillator. Mean and variance over time can be calculated easily, for example by means of moving average algorithms and moving max-min algorithms which are well known. The calculations therefore allow extraction of an indication of the coherence of the data in the received RF signals. If the mean and variance over time, which are calculated by processor circuit 17, are above a pre-defined threshold, the data in the received RF signals is deemed to be incorrect, and the receiver may be immediately reset. The same occurs if the data signal concerns only noise.

Processor circuit 17 may also receive a recovered clock signal $R_H$ and a recovered data flow signal $R_D$ from the clock and data recovery circuit. The processing unit may thus carry out data processing via the processor circuit on the basis of these recovered signals, if the data in the signals received by the receiver is deemed to be correct. The processing unit may thus also form part of a data acquisition system, which includes a memory for acting rapidly in the system. The recovered clock and data signals may be stored in the memory.

The local clock signal CLK, which clocks clock and data recovery circuit 16 and processor circuit 17, may be obtained on the basis of the reference frequency signal from quartz oscillator 7 of local oscillator 6. A certain number of dividers, not shown, may enable the frequency of the reference frequency signal to be divided to supply local clock signal CLK.

Solely by way of non-limiting example, the reference signal frequency may be on the order of 26 MHz, whereas the local clock signal frequency CLK may be selected to be 1 MHz. This local clock signal CLK must, however, be established with a frequency that must be at least 10 times higher than the data flow frequency of the data signal, and preferably 100 times higher. For example, in the case of a data flow of 10 kbits/s, a local clock signal CLK may have a frequency on the order of 1 MHz. This allows the binary data signal $D_{OUT}$ to be oversampled, as explained hereinafter with reference to FIGS. 2 and 3.

FIG. 2 shows the various components of the clock and data recovery circuit 16 of the data processing unit. Owing to this circuit, it is possible to retrieve or recover the data and clock of the data signal according to the data signals received by the receiver. In order to do this, the data signal data and clock recovery operation consists in removing any transitory pulses in the received signals and recovering the transmitted flow of bits. According to a specific coding, the data signal $D_{OUT}$ is made up of a sequence of bits, which may include a maximum of 4 successive bits of the same value before a one bit transition of different value. This allows clock and data recovery circuit 16 of the data processing unit to operate properly.

The clock and data recovery circuit 16 includes a numerical phase lock loop. Data signal $D_{OUT}$, i.e. the data flow, is oversampled using a local clock signal CLK. This local clock signal CLK is derived from the quartz oscillator of the local oscillator as mentioned hereinbefore. In the numerical phase lock loop, the circuit includes a numerically controlled oscillator (NCO) 25, which produces two quadrature pulse signals $I_P$ and $Q_P$ at output, and two counters 21 and 24. NCO oscillator 25 and the two counters 21 and 24 are clocked by the local clock signal CLK. The two counters are capable of counting or counting down according to the level of the data signal at the circuit input. The two counters are signed and capable of being reset. They also include an end position lock to prevent any "reversal".

If data signal $D_{OUT}$ is at a high level to define a "1" data bit, the two counters 21 and 24 perform a count for a duration that corresponds at least to the duration of the data bit. However, when the data signal $D_{OUT}$ is at a low level to define a "0" data bit, the two counters 21 and 24 perform a countdown for at least the duration of the data bit. The first counter 21 is a clock counter, whereas the second counter 24 is a data bit counter.

The first counter 21 is a clock counter, which integrates the data flow on both sides of a bit transition. The transition of a bit concerns the change of the data signal from the "0" state to the "1" state or the change of the data signal from the "1" state to the "0" state. There is no binary transition in data signal $D_{OUT}$ during the change from one bit to another successive bit if the successive bits are in the same "0" or "1" state. The quadrature pulse signal $Q_P$, which is generated by numerically controlled oscillator 25, is supplied to the reset input $Q_R$ of the first counter. If the frequency and phase of pulses $Q_P$ are exactly aligned on those of data signals $D_{OUT}$ at the input of circuit 16, output $H_{OUT}$ is still zero at the moment of each reset following a binary transition in the data signal. However, any shift, during recovery of the recovered clock signal $R_H$ supplied to output $I_P$ of numerically controlled oscillator 25 causes a positive or negative error at the output of clock counter 21 at the time of reset at input $Q_R$ of counter 21.

At the time of each pulse of quadrature pulse signal $Q_P$, the polarity of error E, partly shown in FIG. 3, is directly related to the value of the data signal bit to be processed. This error is thus multiplied in a multiplier 22 by output signal $B_{OUT}$ of the second bit counter 24, which takes account of the value of the data signal bit to be processed. This produces an error that is independent of the value of the data bit. If the generation frequency of pulse signals $I_P$ and $Q_P$ at the output of numerically controlled oscillator 25 is lower than the data signal clock frequency, the error is positive at output $H_{OUT}$, if the data bit is "1" and negative if the data bit is "0". This error at output $H_{OUT}$ must therefore be multiplied by a value "+1" at output $B_{OUT}$ of second counter 24, if the error is positive when the data bit is "1", and by a value "−1" at output $B_{OUT}$, if the error is negative when the data bit is "0".

The same is true if the generation frequency of pulse signals $I_P$ and $Q_P$ at the output of the numerically controlled oscillator is higher than the data signal clock frequency. However, in this case and unlike the aforementioned previous error, the error at output $H_{OUT}$ must be multiplied by a value "−1" at output $B_{OUT}$ of second counter 24 if the error is positive when the data bit is "0", and by a value "+1" at output $B_{OUT}$ if the error is negative when the data bit is "1".

The output signal of multiplier 22 is filtered in a numerical loop filter 23. In the loop filter, a D flip-flop element may be provided, which is clocked by the quadrature pulse signal $Q_P$ of numerically controlled oscillator 25. This flip-flop element enables the loop filter to supply a numerical input signal or binary word $NCO_{IN}$ to numerically controlled oscillator 25. This numerical input signal is supplied at each pulse of quadrature pulse signal $Q_P$, which follows a binary transition in the data signal. If no binary transition has been performed in two successive bits of the data signal, only the preceding value of the numerical input signal is supplied to numerically controlled oscillator 25. The numerical input signal or binary word $NCO_{IN}$ supplied by the loop filter represents output value $H_{OUT}$, i.e. error E weighted or attenuated by loop filter 23 at the time of reset of counter 21. Following the binary transition, this input signal $NCO_{IN}$ corrects the frequency and phase according to the data from the output of first clock counter 21 at the time of quadrature pulse $Q_P$.

The signal is attenuated through loop 23, for example by a factor of 0.25. Of course, if the data from the received radio frequency signals is correct, error E becomes zero at the moment of each pulse of quadrature pulse signal $Q_P$ following each binary transition in the data signal. Via mean and variance calculations in the processor circuit of numerical input signal $NCO_{IN}$, it can thus immediately be seen that both the mean over time and the variance of this signal are close to 0. This therefore means that the data signal is coherent. For this data signal coherence check, several binary transitions in the data signal may therefore be sufficient to determine the coherence of the data signal. Unlike a coherent data signal, the noise variance is never zero and is above a predefined coherence threshold. This thus allows correct data in the received radio frequency signals to be differentiated from incorrect data or simple noise.

It is to be noted that the output signal $H_{OUT}$ of first counter 21 and numerical input signal $NCO_{IN}$ of numerically controlled oscillator 25 are n-bit binary words, for example at least 5 bits (not shown). Consequently, the D flip-flop element in the loop filter may include a D flip-flop for each bit of the binary word, for example 5 flip-flops each clocked by the quadrature pulse signal $Q_P$. However, the output signal of second counter 24 is a 1-bit signal. Binary word $NCO_{IN}$ may thus vary between $-2^n$ and $2^n$.

For the numerical phase lock loop of clock and data recovery circuit 16 to be actuated, a transition must, in principle, be detected in data signal $D_{OUT}$. To achieve this, second counter 24 also supplies data signal $B_{OUT}$ to a transition detector 26, which also receives the in-phase pulse signal $I_P$ from numerically controlled oscillator 25. This transition detector may be formed by a shift register. This in-phase pulse signal $I_P$, which defines the recovered clock signal $R_H$, is also supplied to the reset input $I_R$ of second counter 24. This transition detector 26 supplies the recovered data flow signal $R_D$ at one output. Another output of transition detector 26 maintains the preceding value in loop filter 23 if there is no change of value in the successive data signal bit, as indicated hereinbefore.

The actuation time and stability of the clock and data recovery circuit depend upon the numerical phase lock loop gain, and on the oversampling factor. This oversampling factor relates to the frequency of the local clock signal CLK. If 45 oversampling is carried out, a gain of 0.25 corresponds to the smallest actuation time with acceptable stability. This gain of 0.25 may easily be implemented by a two bit shift.

Since circuit 16 is entirely numerical, the frequency of the local clock signal CLK is an independent variable and the circuit operates in a perfectly identical manner for all the constant f(data flow)/f(CLK) pairs. The frequency of the local clock signal CLK may thus be fixed at 45·f(data flow). Selection of the oversampling factor, for example equal to 45, is directly related to the typical size of the transitory pulses, which can be observed at the demodulator output and in fact defines the recovered clock jitter. This value is also directly connected to the data flow frequency, which may be parametrizable, and to the quartz oscillator frequency, which may have a value of 13 or 26 MHz for example.

The (moving) mean and (moving) variance calculations of the numerical input signal $NCO_{IN}$, correspond to a calculation equivalent to the root mean square (RMS) of the amplitude of these values. If the data clock of data signal $D_{OUT}$ is correctly aligned on the local clock, the RMS value at the input of numerically controlled oscillator 25 is close to zero. The more doubtful the data received, for example in the case of a source of noise, the more the associated RMS value at the input of numerically controlled oscillator 25 increases and the more the latter requires correction.

FIG. 3 shows in a simplified manner various signals over time of the clock and data recovery circuit of the data processing unit according to the invention. In particular, FIG. 3 shows the two in-phase and quadrature pulse signals $I_P$ and $Q_P$ of the numerically controlled oscillator, the output signal of the first clock counter $H_{OUT}$, the output signal of the second bit counter $B_{OUT}$, and the data signal $D_{our}$.

In the case shown, output signal $H_{OUT}$ is very close to 0 following a pulse $Q_P$ supplied by the numerically controlled oscillator for resetting the counter, following a binary transition from "1" to "0" in the data signal. This means that the recovered clock signal is properly adjusted to the data clock and that a recovered data signal of correct data picked up by the receiver has been properly supplied. The data signal may therefore be considered to be coherent. If a positive or negative error E occurs, i.e. at the moment of reset, the output of the first counter is not at 0, correction is performed via the numerically controlled oscillator. The frequency and phase of the pulse signals $I_P$ and $Q_P$ are thus adapted. When there is a "1" bit, the second counter performs a count by increments of one unit on each stroke of the local clock signal CLK. However, when there is a "0" bit, the second counter performs a countdown by decrements of one unit on each stroke of the internal clock signal CLK. The same is true for the first counter, but the reset operation by quadrature pulse signals $Q_P$ occurs between two pulses of the in-phase pulse signal $I_P$. The output signals $H_{OUT}$ and $B_{OUT}$ shown in triangular form, are in reality in the form of steps for the incrementing or decrementing operation at each clock stroke CLK.

From the description that has just been given, several variants of the data processing unit for a receiver of signals carrying data can be devised by those skilled in the art without departing from the scope of the invention defined by the claims. The data signals for the data processing unit may be supplied directly from a transmitter on a transmission channel or in a wired manner without using a demodulator. In the case of a radio frequency signal receiver, a double frequency conversion must be performed before the data signal is supplied to the data processing unit. The receiver may therefore demodulate RF signals by ASK or OOK so as to supply a data signal to be checked by the data processing unit.

What is claimed is:

1. A data processing unit for a receiver of signals carrying data, said data processing unit comprising:
    clock and data recovery circuitry, which is clocked by a local clock signal and which includes a numerical phase lock loop, in which there is a numerically controlled oscillator, which generates as output at least one pulse signal, the phase and frequency of which are adaptable based on a data signal received at an input of the clock and data recovery circuitry, and
    processor circuitry connected to the clock and data recovery circuitry,
    wherein the processor circuitry is configured to calculate the mean and variance over time of a numerical input signal of the numerically controlled oscillator so as to determine coherence of the data signal when the calculated mean and variance are below a predefined coherence threshold, and to perform a reset of the receiver when the calculated mean and variance of the numerical input signal of the numerically controlled oscillator are above the predefined coherence threshold,
    wherein the numerically controlled oscillator supplies the output as an in-phase pulse signal and a quadrature pulse signal,
    wherein the numerical phase lock loop includes a clock counter, which receives the data signal as an input and which is clocked by the local clock signal to oversample the data signal, and
    wherein the clock counter is configured to be reset at a reset input at each pulse of the quadrature pulse signal supplied by the numerically controlled oscillator, and an output signal value of the clock counter at a time of reset following a binary transition of the data signal enables the numerically controlled oscillator to be adapted.

2. The data processing unit according to claim 1, wherein the in-phase pulse signal supplied by the numerically controlled oscillator defines a recovered data clock signal.

3. The data processing unit according to claim 1, wherein the numerical phase lock loop includes a numerical loop filter to filter the output signal of the clock counter so as to supply the numerical input signal to the numerically controlled oscillator during a pulse of the quadrature pulse signal following a binary transition in the data signal.

4. The data processing unit according to claim 3, wherein the numerical loop filter attenuates by a factor K the output signal of the clock counter to supply the numerical input signal, where K is equal to 0.25.

5. The data processing unit according to claim 1,
    wherein the clock and data recovery circuitry includes a data bit counter, which receives the data signal as an input and which is clocked by the local clock signal to oversample the data signal, and
    wherein the data bit counter is reset at a reset input on each pulse of the in-phase pulse signal supplied by the numerically controlled oscillator.

6. The data processing unit according to claim 5, wherein the clock and data recovery circuitry includes transition detector circuitry, which receives an output signal of the data bit counter so as to supply a recovered data signal.

7. The data processing unit according to claim 6,
    wherein the transition detector circuitry is clocked by the in-phase pulse signal of the numerically controlled oscillator, and
    wherein the transition detector circuitry supplies a control signal to a numerical loop filter forcing said numerical loop filter to maintain a preceding numerical input signal to be supplied to the numerically controlled oscillator when the transition detector circuitry does not detect any binary transition of the data signal from one bit to the other.

8. The data processing unit according to claim 5, wherein the numerical phase lock loop includes multiplier circuitry to multiple the output signal of the clock counter by an output signal of the data bit counter, and which is configured to take a value of "+1" for a data signal bit that is "1" and a value of "−1" for a data signal bit that is "0", so as to supply to a numerical loop filter an output signal of the clock counter whose polarity is adapted to a current data signal bit.

9. The data processing unit according to claim 1, wherein the processor circuitry includes memory in which one or more of a moving average algorithm and a moving max-min algorithm are stored, in order to calculate the mean and variance over time of the numerical input signal of the numerically controlled oscillator, so as to determine the coherence of the data signal.

10. A receiver of signals carrying data, said receiver comprising:
an antenna to receive signals carrying data,
at least one low noise amplifier to amplify and filter the signals received by the antenna,
a local oscillator to supply high frequency oscillating signals,
at least one mixer to mix the received filtered and amplified signals with the high frequency oscillating signals supplied by the local oscillator to produce intermediate signals, whose frequency is equal to a difference between the frequency of the high frequency oscillating signals and a carrier frequency of the received signals,
at least one low pass filter to filter the intermediate signals,
a demodulator to receive the filtered intermediate signals to supply a data signal to data processing circuitry, said data processing circuitry including:
clock and data recovery circuitry, which is clocked by a local clock signal and which includes a numerical phase lock loop having a numerically controlled oscillator, the clock and data recovery circuitry generating as output at least one pulse signal, the phase and frequency of which are adaptable based on the data signal, and
processor circuitry connected to the clock and data recovery circuitry to calculate over time the mean and variance of a numerical input signal of the numerically controlled oscillator to determine coherence of the data signal when the calculated mean and variance are below a predefined coherence threshold,
wherein the numerically controlled oscillator supplies the output as an in-phase pulse signal and a quadrature pulse signal,
wherein the numerical phase lock loop includes a clock counter, which receives the data signal as an input and which is clocked by the local clock signal to oversample the data signal, and
wherein the clock counter is configured to be reset at a reset input at each pulse of the quadrature pulse signal supplied by the numerically controlled oscillator, and an output signal value of the counter at a time of reset following a binary transition of the data signal enables the numerically controlled oscillator to be adapted.

11. The receiver according to claim 10, wherein the data processing circuitry is configured to impose immediately a complete reset of the receiver as soon as the calculated mean or variance of the numerical input signal of the numerically controlled oscillator are above the predefined coherence threshold.

12. The receiver according to claim 10, wherein the receiver is a Frequency-Shift Keying (FSK) radio frequency (RF) receiver.

13. The receiver according to claim 10,
wherein the local clock signal originates from a reference signal of the local oscillator, whose frequency is divided by a series of dividers, and
wherein the local clock signal frequency is between 10 and 100 times higher than the data flow frequency of the data signal.

14. The receiver according to claim 13, wherein the local clock signal frequency is equal to 45 times the data flow frequency of the data signal.

* * * * *